(12) United States Patent
Montangero et al.

(10) Patent No.: US 11,333,714 B2
(45) Date of Patent: May 17, 2022

(54) WIRING-INTEGRITY AUTOMATIC MONITORING SYSTEM HAVING IMPROVED FEATURES

(71) Applicant: TECNIKABEL S.P.A., Turin (IT)

(72) Inventors: Paolo Montangero, Volpiano (IT); Andrea Piccini, Volpiano (IT)

(73) Assignee: TECNIKABEL S.P.A., Turin (IT)

( * ) Notice: Subject to any disclaimer, the term of this patent is extended or adjusted under 35 U.S.C. 154(b) by 122 days.

(21) Appl. No.: 16/794,413

(22) Filed: Feb. 19, 2020

(65) Prior Publication Data
US 2020/0264240 A1    Aug. 20, 2020

(30) Foreign Application Priority Data
Feb. 20, 2019  (IT) .......................... 202019000000585

(51) Int. Cl.
*G01R 31/55*    (2020.01)
*E01B 7/24*     (2006.01)
(Continued)

(52) U.S. Cl.
CPC .............. *G01R 31/55* (2020.01); *E01B 7/24* (2013.01); *G01N 27/028* (2013.01); *G01R 31/086* (2013.01)

(58) Field of Classification Search
CPC ...... G01R 31/55; G01R 31/086; G01R 31/54; G01R 31/50; G01R 27/16; G01R 27/18; E01B 7/24; G01N 27/028
See application file for complete search history.

(56) References Cited

U.S. PATENT DOCUMENTS

| | | | | |
|---|---|---|---|---|
| 4,195,805 A | * | 4/1980 | Keep, Jr. ................... | E01B 7/24 104/280 |
| 4,321,643 A | * | 3/1982 | Vernier .................. | H02H 1/003 361/48 |

(Continued)

FOREIGN PATENT DOCUMENTS

| | | |
|---|---|---|
| CN | 204598343 | 8/2015 |
| CN | 205223750 | 5/2016 |

(Continued)

OTHER PUBLICATIONS

Granger et al., "A non-intrusive system for measuring underground power utility cable impedance," 2016 IEEE Power and Energy Society General Meeting (PESGM), IEEE, Jul. 17, 2016, pp. 1-5.
(Continued)

*Primary Examiner* — Tung X Nguyen
*Assistant Examiner* — Feba Pothen
(74) *Attorney, Agent, or Firm* — The Belles Group, P.C.

(57) ABSTRACT

An automatic monitoring system for monitoring the integrity of a wiring having a number of cables, the monitoring system having an integrity measuring unit designed to be coupled to the electrical wires in order to carry out measurements and check for the presence of faults along the electrical conductors, and a detection unit to detect a voltage present in the electrical wires and to enable the integrity measuring unit in case the voltage has a predetermined relation with a voltage threshold, indicating the fact that the electrical load is not powered by the power supply source. The integrity measuring unit has an impedance measuring circuit to apply a measurement signal to a circuit formed by the pair of electrical wires and to obtain a value of the impedance of the same circuit. The integrity measuring unit checks for the presence of a fault depending on the impedance value.

11 Claims, 4 Drawing Sheets

(51) Int. Cl.
*G01R 31/08* (2020.01)
*G01N 27/02* (2006.01)

(56) References Cited

U.S. PATENT DOCUMENTS

| | | | |
|---|---|---|---|
| 9,696,361 B1* | 7/2017 | Sun | G01R 31/11 |
| 2009/0273350 A1* | 11/2009 | Archer | G01R 31/54 |
| | | | 324/522 |
| 2009/0289637 A1* | 11/2009 | Radtke | G01R 31/088 |
| | | | 324/629 |
| 2010/0013498 A1* | 1/2010 | Olguin | H02H 11/001 |
| | | | 324/649 |
| 2015/0077122 A1* | 3/2015 | Laporte | H02H 11/006 |
| | | | 324/424 |
| 2015/0331034 A1 | 11/2015 | Hong et al. | |
| 2016/0154050 A1 | 6/2016 | Hong | |
| 2017/0052222 A1* | 2/2017 | Pasdar | H02H 1/003 |

FOREIGN PATENT DOCUMENTS

| | | |
|---|---|---|
| EP | 2186706 | 5/2010 |
| WO | WO 2010/116319 | 10/2010 |

OTHER PUBLICATIONS

Xiangjun et al., "Anti theft and monitoring system of street lamp power cables," Power and Energy Engineering Conference, 2009, APPEEC 2009, Asia-Pacific, IEEE,Mar. 27, 2009, pp. 1-4.
European Search Report issued in European Application No. EP20158184, dated Jul. 22, 2020.

* cited by examiner

WIRING-INTEGRITY AUTOMATIC MONITORING SYSTEM HAVING IMPROVED FEATURES

CROSS-REFERENCE TO RELATED APPLICATIONS

This Patent application claims priority from Italian Utility Model application no. 202019000000585 filed on Feb. 20, 2019, the entire disclosure of which is incorporated herein by reference.

TECHNICAL FIELD

The invention relates to an automatic monitoring system with improved features, which is designed for controlling the integrity of an electrical connection or wiring including conductor cables and, furthermore, for generating and notifying suitable alarm signals upon detection of a lack of integrity of the electrical connection (for example due to an interruption or cut).

This solution refers to utility model application no. 202018000001794 filed on Jan. 2, 2018 by the Applicant, representing a further inventive development thereof, which overcomes some limitations and improves the efficiency as well as the performances of the monitoring system.

BACKGROUND OF THE INVENTION

As it is known, the price of copper, which is always very high, recently led to an increase in the number of thefts of electrical cables, especially in wirings characterized by a large cross section, by a great length (in the range of kilometres) and laid, typically outdoor, in situations and places that can hardly be defended and controlled.

Wirings of this type can be found, for example, in the networks and electrical connections used for the distribution of power, in the electrical wirings of railway networks and of telecommunication networks.

In the railway field, for example, so-called "snow-melting" systems for railroad switches are used, which entail the use of electrical cables laid along the tracks in order to supply power to heating elements (so-called "heaters"), which are fixed on the rails in the area of the switches and are designed to assure that the same switches can be used and are fully functional even in case of snow and ice.

In these systems, it usually is not possible to easily know the state of integrity of the electrical cables, unless the operation thereof is controlled after the systems have been activated and powered. As a consequence, in case of interruptions of the electrical connections, it may happen that the snow-melting system is not capable of operating when its intervention is needed, which can lead to serious consequences for the correct operation of the switches and for railway traffic safety.

In general, it is evident that the damage caused by the theft of copper cables goes way beyond the cost of restoring the cables, since the theft creates situations of prolonged inefficiency with actual and reputation damages as well as safety risks.

Therefore, in these systems there is a strong need for automatic monitoring systems, which are designed to warn in real time about the presence of damages, such as cuts or interruptions, of the electrical cable due to intentional causes (for instance, theft) and/or accidental causes (for instance, an accidental cut of an underground electrical cable during work operations).

The solution suggested by the aforesaid utility model application no. 202018000001794 can be applied in these situations, offering a system for monitoring the integrity of a wiring, which is capable of detecting the presence of possible damages and generating suitable alarm signals.

Even though it is advantageous, the system described in the aforesaid utility model application can have some critical points, at least in given operating conditions, as discussed below with reference to FIG. 1, which, in order to better explain the problems, relates to an electrical heating system for railway switches (so-called "RED systems").

The aforesaid critical point are due to "non-controllable" conditions of already existing systems and, in particular, to problems deriving both from weather conditions (temperature, dry or wet cables) and from the way in which the wiring cables are laid (distance between the cables, uneven lengths, path differences).

RED systems are usually built with single-core conductor cables, which connect the power supply cabinet to a three-phase step-down transformer, which is placed close to the switches. The step-down transformer operates to lower the voltage of 400 V to lower and safer values (safety extra-low voltage—SELV circuits), for example 24 V, to be supplied to the heater elements fixed on the rails and on the movable parts of the switch. For each transformer, three single-core cables are used, which have a cross section that is suitable to supply power to the so-called "heaters".

The cables are normally laid in concrete tunnels and/or raceways and/or cable-holder pipes, which extend along the tracks and bypass possible obstacles present along the path. The tunnels and/or raceways and/or pipes, despite protecting the cables, do not prevent the cables from coming into contact with water due to rainfalls or snowfalls, do not prevent dust and soil from settling on the cables and do not prevent the cables from being subjected to sudden changes in temperature, even by some dozens of Celsius degrees, depending on the changes in the outdoor temperature registered in seasonal cycles (summer/winter) and in daily cycles (day/night). Therefore, in these installations, water and/or humidity and sometimes even mud are likely to be trapped between the cables, then remaining there for a long time at least in some stretches. Moreover, the cables are subjected to significant changes in temperature.

The laying of the cables, depending on the degree of prior occupation of the tunnel (layering of different cables, presence of obsolete cables, etc.) and on the obstacles to be bypassed, which are present between the electrical cabinet and the point where the transformer is located, does not always ensure that the three cables connected to the three power supply phases exactly follow the same path and exactly have the same length. It can happen that a cable has to follow a different path, at least along a given stretch, which corresponds to a different length, or that it is installed leaving a greater "richness" (for example, in the form of cable loops in a manhole). Even when the three single-core cables are laid in the same tunnel or raceway, there is no certainty of the distance separating them, which, in general, is not constant and can significantly change along the entire path.

While the conditions described above do not create any difficulty of operation of the electrical heating system used for the switches, they can affect the correct operation of the monitoring system suggested in the aforesaid utility model application no. 202018000001794.

This monitoring system, indeed, is exclusively based on the execution of an echo-ranging or echometer measurement of the length of the wiring, this measurement being carried out connecting an echometer to two single-core cables (relating to two phases connected to the step-down transformer), thus creating the transmissive line on which the echometer carries out the measurement.

The echometer measurement of the length of the wiring is simple and reliable when the transmissive line subjected to the measurement has an impedance that is constant over the entire length of the wiring.

Changes in the impedance along the wiring, on the other hand, cause reflections and signal losses, which, if relevant, can alter and confuse the response of the echometer to such an extent that the correct measurement of the wiring length is jeopardized.

When the transmission line consists of two independent wires (the single-core cables, in the case discussed herein), the echometer behaviour thereof depends on different factors, the main ones being the distance between the two wires and the dielectric separating them. In particular, the effect of the presence of water, with its relative dielectric constant ($\varepsilon_{aq}$=80), between the wires instead of air ($\varepsilon_{air}$=1) implies a significant impedance change, with the generation of a high reflected signal in the echometer trace and with a remarkable reduction of the speed of propagation of the measurement signal.

Therefore, it is clear that the wiring conditions described above can translate into impedance changes, with the consequence of originating reflections and fake results in the echometer measurement, and the change in the speed of propagation of the measurement signal can lead to errors in the assessment of the length of the wiring.

Hence, it is possible that, in situations like the ones described above, the echometer measurement is wrong, changes over time and is unreliable, thus generating an incorrect measurement of the wiring length.

Even though they are rare, the situations described above lead to a risk that cannot be neglected, namely the risk that the monitoring system based on the sole estimation of the length o the wiring, which is detected by means of an echometer measurement, can produce false alarms and/or fail to detect anomalous situations.

Therefore, there is a strong need for an improved solution, allowing the monitoring and warning system to be used in all possible weather and installation situations with results that are always good and reliable.

SUMMARY OF THE INVENTION

The object of the invention is to answer to the problems described above and to fulfil the aforesaid need, overcoming the limits of known solutions and, in particular, of the solution described in the aforesaid utility model application, so as to offer a highly reliable and flexible solution, namely a solution that can be successfully used in the most different conditions of installation and wiring.

Hence, according to the solution of this invention, an automatic monitoring system for monitoring the integrity of a wiring having improved features is provided, as set forth in the appended claims.

BRIEF DESCRIPTION OF THE DRAWINGS

The invention will be best understood upon perusal of the following detailed description of preferred embodiments, by mere way of non-limiting example, and with reference to the accompanying drawings, in which.

DETAILED DESCRIPTION OF THE INVENTION

An aspect of the invention entails providing a monitoring system, which finds particular application in the monitoring of systems and wirings including electrical cables, even with a length of many kilometres, which connect a power supply source to associated electrical loads and are laid outdoor, in situations that are not controlled and are not particularly protected, especially to be used in the railway field.

The monitoring system is automatically capable of monitoring the integrity of the wiring, warning in real time about the presence of anomalous situations caused by the disconnection of the load, like when a conductor cable of the wiring is interrupted.

As discussed more in detail below, a particular aspect of this solution, which represents a distinctive and improving element compared to the aforesaid application no. 202018000001794, entails implementing an impedance measurement to assess the integrity or lack of integrity of the wiring when the same wiring is not powered.

Hence, the detection of an alarm condition, in the absence of voltage in the wiring, is based on the result of an impedance measurement, which is carried out in the circuit created by the monitoring system, two wires of the wiring and the load. The measurement of the impedance of this circuit, compared with predefined expected values, allows the state of integrity of the wiring to be established and an alarm warning mechanisms to be activated when the detected value is significantly different from the expected value.

Figure 1:
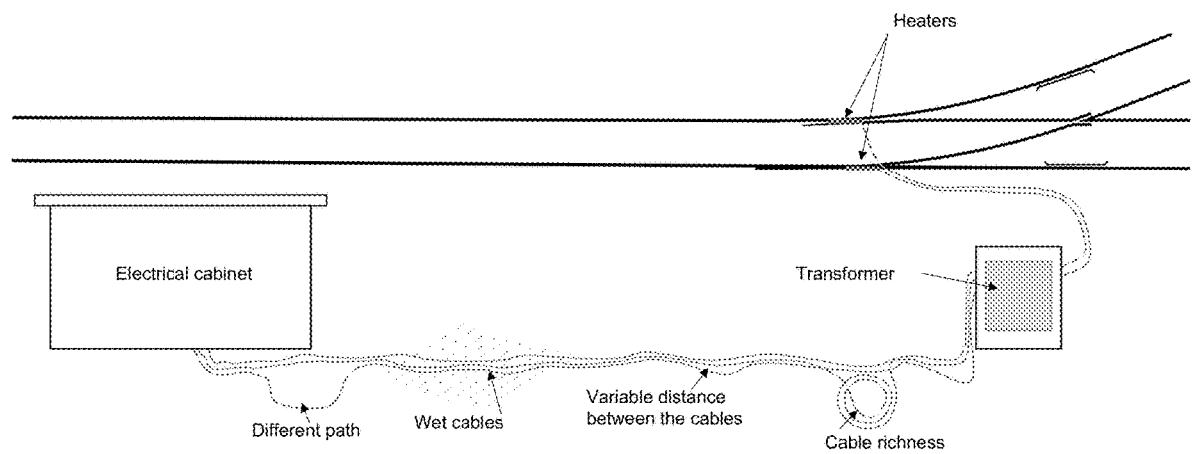
FIG. 1 is a schematic diagram of an electrical heating system for railroad switches, showing the problems that can be associated with a wiring including single-core cables.
Figure 2:
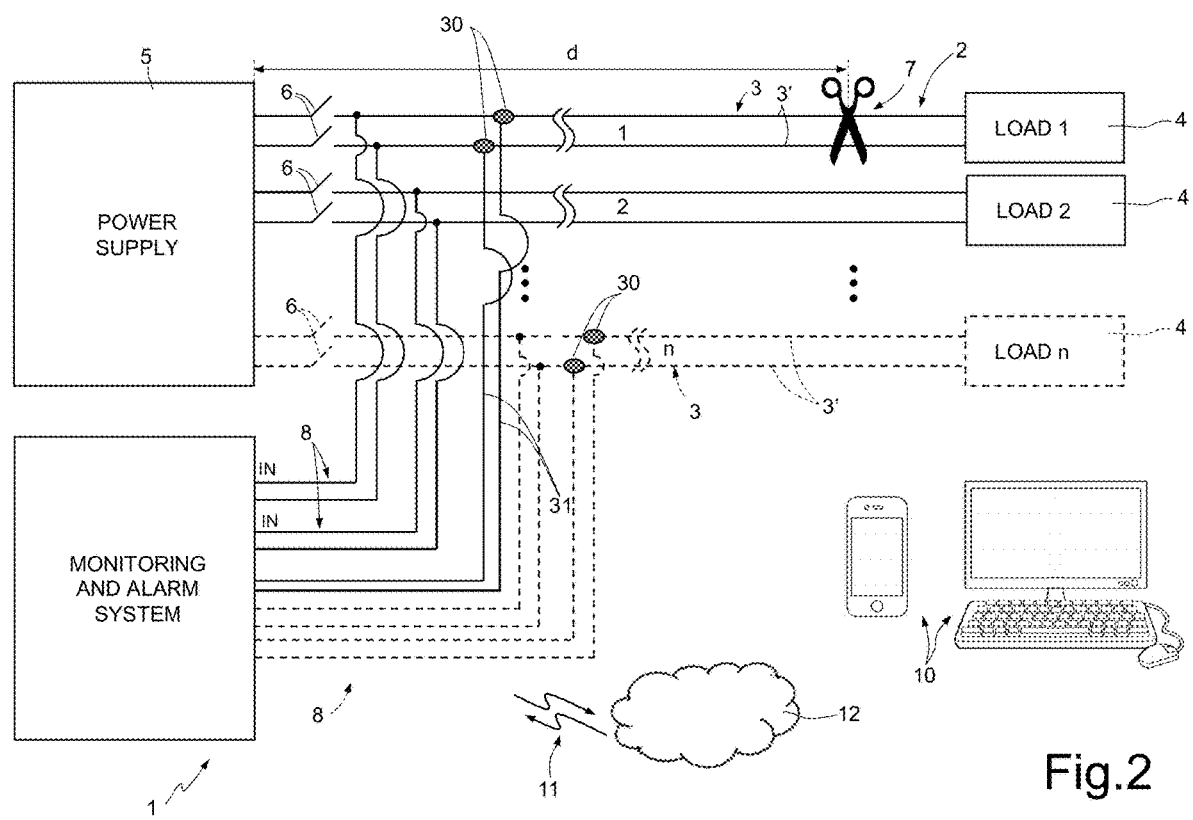
FIG. 2 is a schematic block diagram of an electrical system comprising a wiring, which uses an automatic monitoring system for monitoring the integrity of the wiring according to an embodiment of the invention.

FIG. 2 shows the monitoring system, indicated, as a whole, with 1, designed to monitor the integrity of a wiring 2, which comprises at least one cable 3 having a group (in the example, a pair) of electrical conductors or wires 3', which are designed to power an electrical load 4 located in a remote position; in case of a three-phase power supply, the wiring 2 comprises, in a known manner, three electrical wires 3' (for example, connecting the power supply source to a three-phase transformer).

In the example shown herein, the wiring 2 comprises a plurality of cables 3 (indicated with a progressive index from 1 to n, with n being the total number of cables) and of corresponding groups of electrical wires 3', each designed to supply power to a respective electrical load 4.

Each cable 3 does not necessarily consist of a multi-core cable (namely, of several isolated wires surrounded by one single outer sheath), but, according to this solution, it can consist of independent single-core cables (the electrical wires 3'), which are generally laid along the same path and are designed to supply power to a respective electrical load 4, which is arranged in a remote position.

The power supply is generated by a power supply source 5, which is separated from the electrical load 4 by the length of the wiring 2, a length that can range up to different kilometres.

Power supply switches 6, which are arranged in the area of the power supply source 5, selectively connect the power supply source 5 to the electrical wires 3' of respective cables 3; hence, in general, there is a number of power supply switches 6, for each cable 3, which is equal to the number of corresponding electrical wires 3'.

The monitoring system 1 is designed to detect the presence of at least one fault 7, for example an interruption or cut, associated with at least one pair of electrical wires 3' of the wiring 2 (the interruption possibly affecting one single electrical wire 3'), as schematically shown in the aforesaid FIG. 2.

According to a further aspect, as described more in detail below, the monitoring system 1 is further designed to determine the distance d at which the interruption or cut is located, relative to the position of the power supply source or to the point at which the monitoring system 1 is connected to the wiring 2.

In particular, the monitoring system 1 is connected to the wiring 2 and to the electrical wires 3' of each cable 3 downstream of the power supply switches 6 by means of suitable connection cables 8. For example, the aforesaid connection cables 8 can be fastened to a same terminal board (nor shown in FIG. 2), where the power supply switches 6 and the electrical cables 3' are also secured.

Hence, in general, the monitoring system 1 is connected to at least one pair of electrical wires 3', which connect the respective electrical load 4 and make up, every time, the pair of wires to be measured. In the solution shown in FIG. 2, where the system to be monitored consists of n electrical loads 4 powered, by means of power supply switches 6, by respective n cables 3 and respective electrical wires 3', the monitoring system 1 is connected to the electrical wires 3' by means of n groups of connection cables 8, which lead the electrical wires 3' to respective inputs IN of the monitoring system 1 (each group comprising, for example, two connection cables 8 or three connection cables 8 in case of a three-phase power supply).

As discussed more in detail below, the monitoring system 1 can further be interfaced with external processing units 10, such as desktop computers or laptop computers, mobile devices, such as tablets, phablets or smartphones, both to interrogate the monitoring system 1 on the presence of alarms and faults and to configure the same system. The connection to these external processing units 10 can take place through communication interfaces 11 of different types (Ethernet, Wi-Fi, Bluetooth, GSM, serial, etc.).

Through one or more of these communication interfaces 11, the monitoring system 1 can also be connected to a remote storage unit 12 (for a so-called "cloud" storage).

Figure 3:
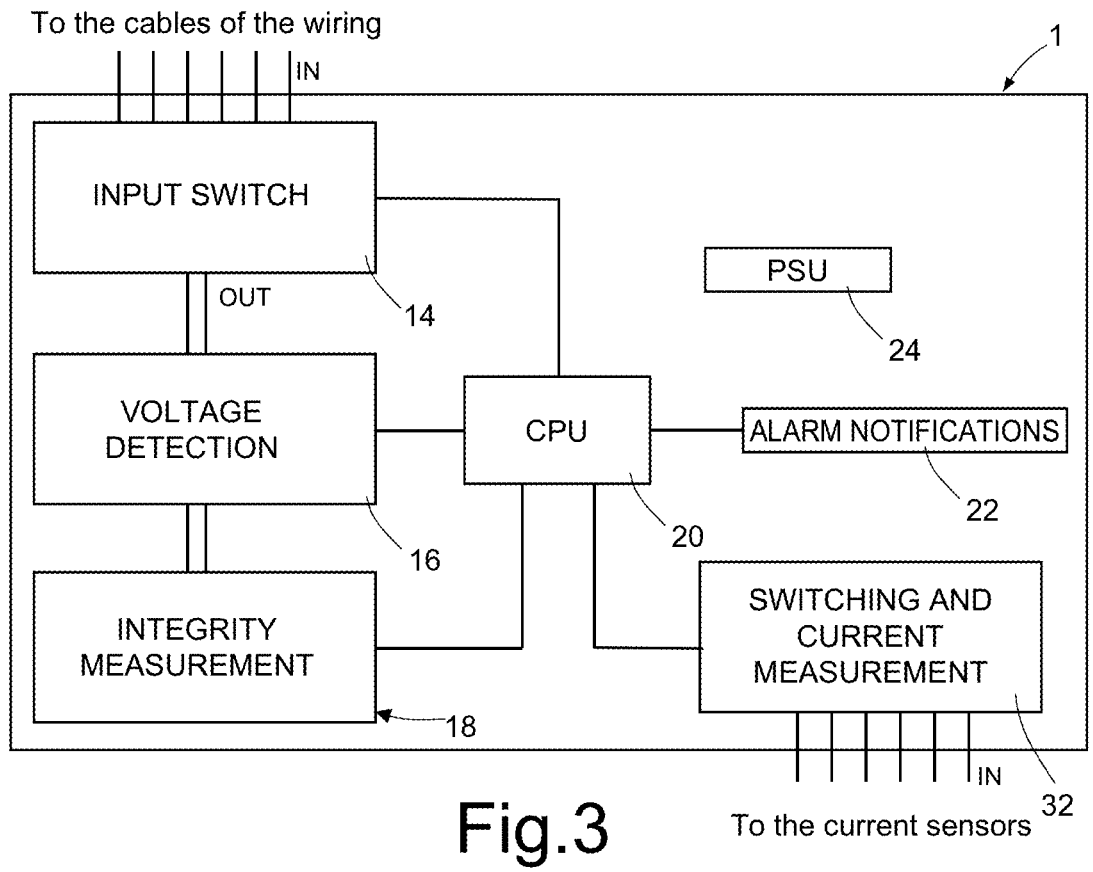
FIG. 3 is a block diagram of the monitoring system of the electrical system of FIG. 2.

More in detail and with reference to FIG. 3, the monitoring system 1 comprises an input switching unit 14, which is coupled to the inputs IN and is designed to implement a selective connection between respective inputs IN (and respective groups of electrical wires 3') and an output line OUT of the input switching unit 14; in a possible implementation, the input switching unit 14 allows the different pairs of electrical wires 3' of the cables 3 of the wiring 2 to be sequentially connected to the output line OUT, basically allowing the different cables 3 to share the monitoring system 1 and be sequentially monitored in terms of their integrity.

Therefore, the input switching unit 14 of the monitoring system 1 is advantageously controlled so as to automatically switch, in a sequentially predetermined manner, all the cables 3 connected to the system, so as to carry out the monitoring of the respective pairs of electrical wires 3' in a continuous manner, repeating continuously, or at predetermined intervals, the scanning of the connected electrical wires 3'. Even for systems where there is a large number of electrical wires 3' to be monitored, the monitoring system 1, in this way, manages to detect, in a very small amount of time, in the range of some dozens of seconds, the state of health of all the electrical wires 3' connected.

For example, the input switching unit 14 can be obtained by means of a proper number of relays (not shown), which, being suitably controlled, open or close one or more electrical contacts. The same input switching unit 14 can be provided in different sizes depending on the needs of the system where the monitoring system 1 is installed.

In case of a three-phase power supply, the input switching unit 14, for each cable 3, is configured to couple the output unit OUT, in sequence, to the three three-phase pairs formed by the electrical wires 3' of the same cable 3.

Hence, the output line OUT of the input switching unit 14 consists, in the example discussed herein, of the pair of wires to be measured, whose integrity needs to be monitored.

The monitoring system 1 further comprises: a voltage detection unit 16, which has an input connected to the output line OUT of the input switching unit 14 and a respective output; and an integrity measuring unit 18, which is coupled to the voltage detection unit 16.

The voltage detection unit 16 is configured to check the voltage present in the pair of wires to be measured selected by the input switching unit 14 and to connect, at the output, the same pair of wires to be measured to the integrity measuring unit 18, in case the voltage between the wires of the pairs is detected to be below a predetermined threshold (for example 10 V).

When, on the other hand, the voltage is detected to be equal to or greater than the predetermined threshold value, the voltage detection unit 16 interrupts the connection of the input pair to be measured towards the output; in this condition, the integrity measuring unit 18 is kept electrically isolated.

The operating times of the voltage detection unit 16 are quick and such as to effectively protect the circuits connected to the output thereof from voltages that could damage the same circuits.

The integrity measuring unit 18 is configured, as discussed more in detail below, to carry out suitable electrical measurements of the circuit connected through the pair of wires to be measured selected by the input switching unit 14 when voltage is not present on the same pair of wires, these electrical measurements being aimed at establishing the integrity, or lack of integrity, of the wiring under examination.

The monitoring system 1 further comprises a central processing unit (CPU) 20, which controls the general operation of the system and implements the sequence of monitoring operations, possible further processing of the measurement data and notification of alarms.

In particular, the central processing unit 20 is operatively coupled to the input switching unit 14, so as to control the selective switching of the inputs IN; to the voltage detection unit 16, so as to enable, or not to enable, the integrity measuring unit 18 depending on the result of the comparison between the measured voltage and the predetermined threshold; and to the integrity measuring unit 18, in order to assist determining the presence or absence of a fault in the electrical wires 3' being measured and monitored (and, as discussed more in detail below, in order to possible estimate the position of the fault).

The monitoring system 1 further comprises an alarm generation and notification unit 22, which is also operatively coupled to the central processing unit 20 and is controlled for the generation and notification, locally in the area of the monitoring system 1 or remotely, of proper alarm signals, every time there is a lack of integrity of the wiring 2.

The transmission of the alarm by the alarm generation and notification unit 22 can take place in different ways, for example through SMS textual messages sent to predefined telephone numbers, through e-mails sent to predefined e-mail addresses, through push notifications or other types of tools, and allows information concerning the detected fault to be automatically transmitted, these information comprising: the identification of the cable of the wiring 2 (for example, "Cable b"); the time in which the fault took place (for example, in the form day, hours, minutes, seconds); the type of fault (for example, short-circuit or open circuit); possibly, as discussed more in detail below, the position of the fault along the wiring 2 (for example, at a distance d of 845.32 m).

The alarm generation and notification unit 22 can include different communication interfaces (for example, Ethernet, Wi-Fi, Bluetooth, serial, GSM, etc.), which can be used to send the aforesaid SMS text messages and/or e-mails, with the detailed information concerning the detected alarm, to authorities, to people in charge and/or to available operators.

Therefore, the notification of the fault is sent upon occurrence of the alarm situation, in an extremely quick manner, thus allowing for prompt interventions, for example in order to restore the integrity of the wiring 2.

The monitoring system 1 further comprises a power supply unit—PSU 24, which supplies power to the different units making up the system and, in particular, to the input switching unit 14, to the voltage detection unit 16, to the integrity measuring unit 18, to the central processing unit 20 and to the alarm generation and notification unit 22. The power supply unit 24 can be connected to the power distribution network and is advantageously provided with one or more buffer batteries in order to ensure the operation of the monitoring system 1 even in the absence of power.

In a possible embodiment (see FIG. 2), current sensors 30 can be placed on the electrical wires 3' of the cables 3 of the wiring 2, in particular downstream of the power supply switches 6.

These current sensors 30 (for example, three for each cable 3, in case of a three-phase power supply for the electrical load 4) can be connected to further inputs of the monitoring system 1 by means of respective connection cables 31.

In particular (see FIG. 3), the monitoring system 1 can comprise, in this case, a switching and measuring unit 32, which is coupled to the further inputs and to the current sensors 30 and is configured to select, every time, the current sensors 30 associated with the pair of wires to be measured and to read the voltage value proportional to the current flowing in the sensors (as discussed more in detail below).

In this case, the alarm generation and notification unit 22 and the power supply unit 24 are also coupled to the aforesaid switching and measuring unit 32.

Figures 4A, 4B:
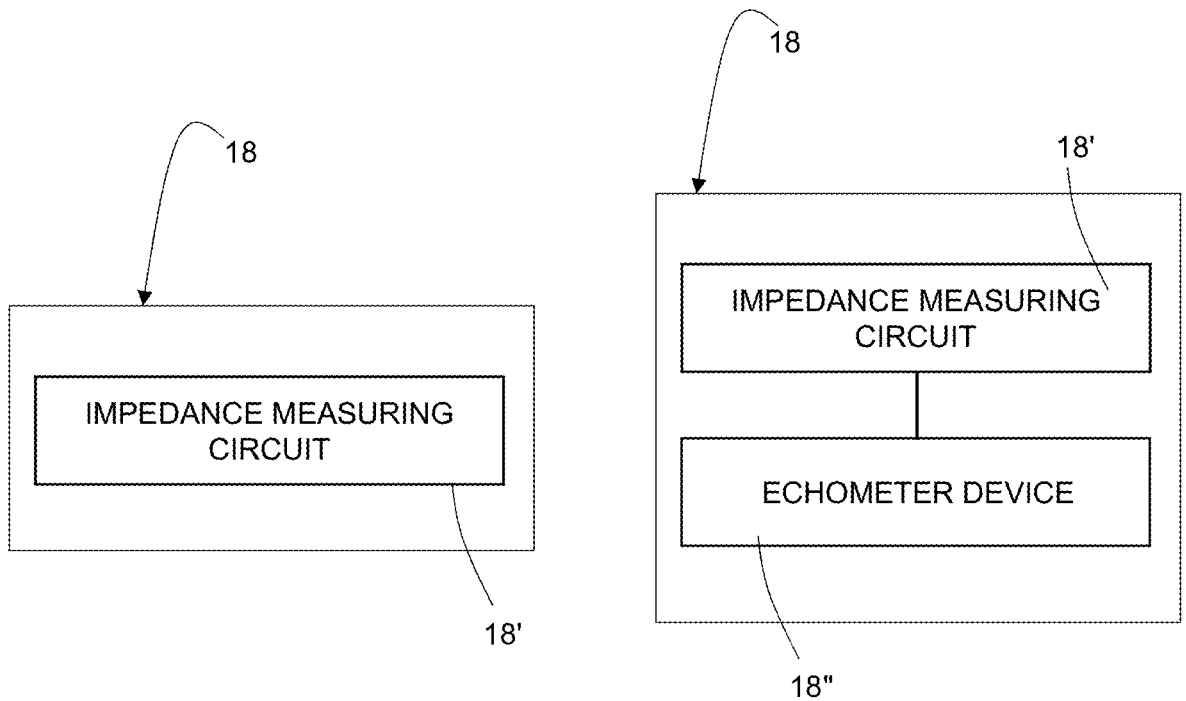
FIG. 4A is a block diagram concerning a first embodiment of an integrity detection unit of the monitoring system of FIG. 3.
FIG. 4B is a block diagram concerning a second embodiment of an integrity detection unit of the monitoring system of FIG. 3.

As shown in FIG. 4A, according to a particular aspect of the solution disclosed herein, the integrity measuring unit 18 of the monitoring system 1 comprises an impedance measuring circuit 18', which is configured to apply an AC signal to the circuit to be measured (including the pair of wires to be measured) and obtain a value of the impedance of the circuit. In particular, the integrity measuring unit 18 uses the impedance measurement to establish the integrity of the wiring.

Figure 5:
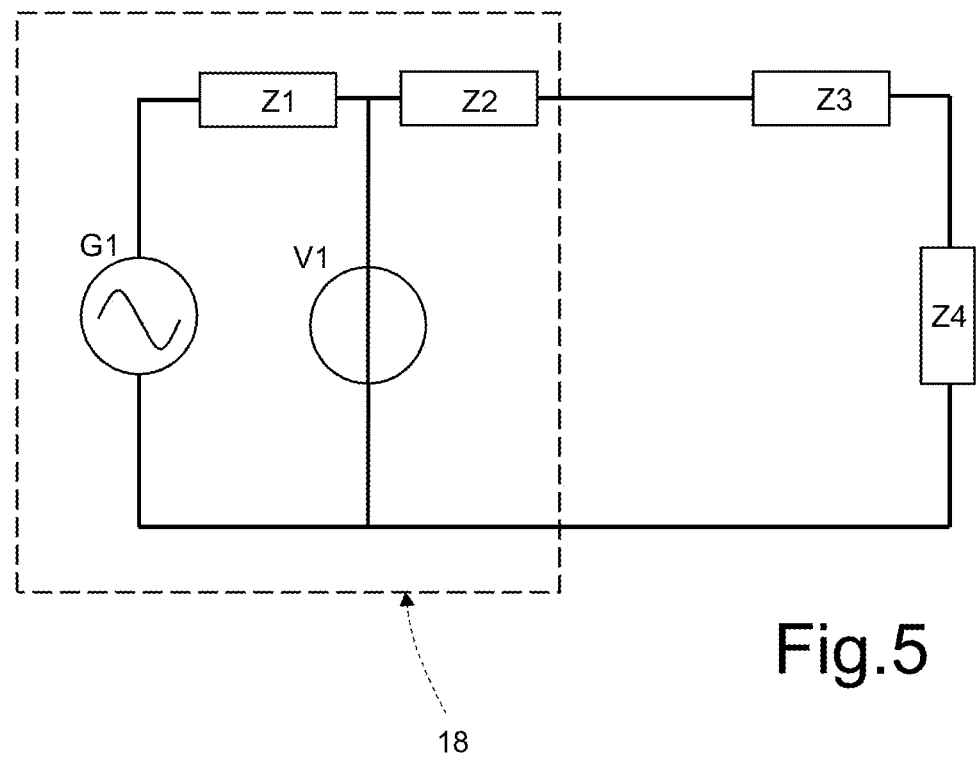
FIG. 5 is a schematic block diagram concerning an impedance measuring unit in the integrity detection unit of the monitoring system of FIG. 3.

The aforesaid impedance measurement will now be described in greater detail with reference to FIG. 5.

A generator G1 generates an alternating voltage with a given frequency and a small amplitude (for example, with a value of 2 V at 50 Hz), which is applied to the circuit consisting of the two impedances Z1 and Z2, which are part of the measuring circuit and are integrated in the integrity measuring unit 18, and of the two impedances Z3 and Z4, which represent the pair of wires 3' to be measured and the elements connected thereto.

A voltmeter V1, for example a root mean square AC voltmeter, is connected to a pole of the generator and at the point of connection of the two impedances Z1 and Z2.

The circuit to be measured, which is created when, in the absence of voltage, the input switching unit 14 connects a pair of wires 3' to the integrity measuring unit 18, is schematically represented by the two impedances in series, Z3 and Z4. For example, Z3 represents the impedance of the circuit to be measured consisting of the connection wires 3' between the power supply source 5 and the remote step-down transformer, whereas Z4 represents the impedance (of the primary winding) of the same transformer.

In case of cut of the cable (and of a consequent open circuit), the circuit represented by the impedances in series Z3 and Z4 is interrupted and the voltage detected by the voltmeter reaches a maximum value.

When the wiring 2 is intact, the voltage detected by the voltmeter V1 is at a low value, which, in any case, is much lower than the one characterizing the open circuit (namely, the interrupted wiring) and is easily distinguishable and recognizable in any weather condition, environmental condition and system condition compared to the voltage values that are typical for an interrupted cable condition.

The comparison between the voltage value detected by the voltmeter V1 and a threshold voltage value, which is properly pre-set and stored in the monitoring system 1, allows to identify, with certainty and in a reliable manner, all the anomalous situations due to an interruption of the connection taking place at the pair of wires to be measured.

As shown in FIG. 4B, according to a further embodiment of the invention, the integrity measuring unit 18 of the monitoring system 1 can further comprise, in addition to the aforesaid impedance measuring circuit 18', an echo-ranging or echometer device 18", in particular a time-domain reflectometer (TDR) based on time-domain reflectometry, which is configured to send a suitable measuring signal to the pair of electrical wires 3' which, each time, are subjected to measurement.

In this embodiment, the integrity measuring unit 18 uses the aforesaid impedance measuring circuit 18' to detect the presence of a fault concerning the lack of integrity of the wiring and, furthermore, in a joint manner, the aforesaid echometer device 18" to locate the point, the position, along the wiring of the possible fault detected with the impedance measurement.

The operation of the echometer device 18" is described in detail in the aforesaid application no. 202018000001794; according to this operation, in general, the measurement signal sent to the pair of electrical wires 3', in the presence of a change in the impedance of the transmissive line consisting of the same pair of electrical wires 3', is reflected in a certain proportion, depending on the extent of the impedance change.

Hence, by assessing the features of the reflected signal (the so-called "echometer trace"), the integrity measuring unit 18 can establish the type of fault present along the electrical wires 3', for example identifying the presence of a short-circuit or of an open circuit.

Furthermore, advantageously, by measuring the time elapsing between the transmission of the measurement signal and the reception of the reflected signal, the integrity measuring unit 18 can locate the point at which the fault is located calculating the distance d along the wiring 2 (for example, relative to the position of the power supply source 5 or relative to the point in which the connection cables 8 are coupled to the wiring 2).

Automatic operation of the monitoring system 1 thus causes the cables 3 (and the corresponding electrical wires 3') of the wiring 2 to be sequentially measured, detecting and analysing the impedance thereof.

When there is a fault, for example due to the fact that at least one of the electrical wires 3' was cut in a point between the power supply source 5 and the electrical load 4, the monitoring system 1 detects the fault with the impedance measurement and, possibly, locates it with the echometer measurement (determining, for instance, the distance d along the wiring 2 from the point of connection of the monitoring system 1).

Advantageously, the monitoring system 1 can further confirm the fault, repeating the measurement a given number k of times (the number k can be defined during an initial system configuration phase), and, then, it can notify the alarm condition by means of the predetermined tools, for example sending messages to predefined telephone numbers and/or sending e-mails to configured addresses. The telephone numbers and the e-mail addresses can be also defined during the initial configuration of the monitoring system 1.

More in detail, after having completed an initialization phase (during which, for example, the measurement thresholds and the design features of the wiring are set, for example in terms of impedance and of other characteristic electrical values), the monitoring system 1 can shift to an automatic monitoring mode.

In this operating mode, the central processing unit 20 controls the input switching unit 14 so as to connect the integrity measuring unit 18 to a first pair of electrical wires 3' of the wiring 2.

The voltage detection unit 16 checks for the presence or absence of a voltage exceeding a pre-set threshold value in the electrical wires 3'.

Only in case the detection unit 16 detects the presence of a voltage which is smaller than or equal to the pre-set threshold value, the system proceeds with the impedance measurements of the first pair of electrical wires 3.

In particular, if the measured value is smaller than or equal to the impedance threshold value, the integrity measuring unit 18 identifies the impedance measurement as regular and does not notify any alarm signal, moving on to the examination of the following pair of electrical wires 3'.

If, on the other hand, the measurement carried out shows an impedance value exceeding the pre-set threshold value, this condition indicating a fault, the monitoring system 1 can repeat the measurement a (predetermined) given number of times m to check if the anomalous condition persists and, when the repetitions of the measurement all show an impedance value exceeding the pre-set threshold, the monitoring system 1 automatically notifies a "High Impedance" alarm condition in the pair of wires 3' under measured. As already mentioned above, this notification can take place sending an SMS text message to the stored telephone numbers and/or sending an e-mail to the stored addresses.

Then, in addition, the echometer measurement can be carried out in order to assess the resulting length of the wiring; the detected length will be communicated with a new notification, also indicating the "normal" length value for that wiring and, as a consequence, pointing out the position of the identified fault.

The alarm condition can also be signalled locally, in the area where the monitoring system 1 is located, through the turning-on of a light indicator and/or through the activation of a sound alarm. The data transmitted in a first SMS and/or e-mail notification indicates the moment in which the fault took place (day, hour, minutes, seconds), the identification of the cable of the wiring 2 and the "high impedance" alarm; a second notification communicates—again—day, hour, minutes and seconds and further indicates the measured length and the expected length.

These information allow operators to decide the type of intervention needed to solve the issue. The alarm data can also be stored in a remote storage area (cloud), for example in the remote storage unit 12, where the same data can be accessed in any moment through standard access procedures, for example through the external processing units 10 (pc, tablet, smartphone, etc.).

If, on the other hand, the voltage measured by the voltage detection unit 16 exceeds the threshold value, the monitoring system 1 does not carry out the aforesaid impedance and echometer measurements on the pair of electrical wires 3' being examined and can move on to the examination of the following pair of wires.

Alternatively, if the current sensors 30 are present, the monitoring system 1 (in particular, the corresponding central processing unit 20) inhibits and electrically isolates the integrity measuring unit 18 and activates the switching and measuring unit 32 for management of measurement of the currents in the cables where the voltage was detected.

Similarly to the task fulfilled by the input switching unit 14, the switching and measuring unit 32 is capable of sequentially reading, trough the current sensors 30 installed on the cables, the values of the current flowing in the wires 3' (of the group of electrical wires 3' to be measured). The detected current values, compared with a threshold value set during a configuration phase or pre-loaded at manufacturing, allow the integrity or lack of integrity of the wiring to be measured to be assessed.

In particular, if the detected current is greater than or equal to the threshold value (a condition indicating the presence of a powered cable 3 with a regular operation of the system), the monitoring system 1 interprets this condition as indicative of a regular operation of the system and of integrity of the electrical wires 3', so that the monitoring system moves on to examining the current in the following electrical wire 3'.

If, other the other hand, the measured current is below the predetermined threshold value, the monitoring system 1, after having checked for a number of times (which can be set) that this condition persists, notifies a "current fault" alarm; this alarm notification advantageously is different from the "high impedance" alarm notification provided in case of detection of a fault of the monitored cable 3 in the absence of voltage.

Following this alarm, operators can advantageously interrupt the power supply to the cable 3 experiencing the alarm (possibly, even through a remote control), so as to allow the monitoring system 1 to also carry out the impedance and, if necessary, echometer check in order to determine the presence and, possibly, the position and the type of fault present in the cable 3 under measurement.

In a possible embodiment, the monitoring system 1 can itself be configured so as to control the power supply switches 6 in order to cut the supply of power to the cables 3 experiencing the alarm and so as to allow execution of the detailed integrity analyses to which the cable and the corresponding electrical wires 3' have to be subjected.

The procedure for the configuration and first operation of the monitoring system 1 is now described in more details.

After having been installed, the monitoring system 1 can be configured by connecting it (via Bluetooth, Wi-Fi or the like) to the external processing system 10 (PC, smartphone, tablet, etc.) provided with a suitable configuration program. Through a graphic user interface (GUI) it is possible to load and store the operating parameters of the system (for example, in order to enable a continuously repeated scanning of all pairs of electrical wires 3' of the wiring 2 or a scanning at predetermined time intervals; in order to define threshold values to be used to define faults; in order to load the lengths of the wirings; in order to define the number of measurements to be carried out and averaged for confirming the results; etc.), the e-mail addresses and the telephone numbers for the notifications as well as load new firmware versions. After having loaded and saved the configuration data, the system can start operating in an automatic operating mode, as already described above in detail.

The advantages of the solution disclosed herein can be assumed in an evident manner from the description above.

In any case, it is again underlined that the monitoring system ensures a continuous, accurate and prompt monitoring of the integrity of the cables of a wiring.

In particular, as already mentioned above, the use of the impedance measurement allows for an assessment of the integrity of the wiring in any weather condition, environmental condition and system condition (for example with reference to the laying of the cables, their path, etc.).

In case of cut and interruption even of one single electrical wire of the cables of the wiring, the monitoring system immediately generates an alarm, which can be notified with a plurality of methods, so as to allow suitable intervention procedures to be activated.

The system can provide different information on the detected fault, among which the type, the distance along the cable of the point where the fault occurred (through the joint echometer measurements), the time instant in which the fault took place.

The monitoring system operates, in general, on the electrical connection when the same is not working and the electrical loads are not powered, namely when the cable is not subjected to voltage, and it is automatically activated and deactivated depending on whether the voltage is applied to the cable or interrupted.

However, the monitoring system is further advantageously configured to provide indications on the integrity of the wirings even when the system is working and the cables are under voltage, through the detection of the electric current flowing along the cables and the comparison with a reference threshold, which is indicative of a normal operation condition.

In particular, the monitoring system is capable of automatically switching between the wiring integrity measuring modes (through checking of the circulating current, or by means of more accurate checks based on impedance measurements and, possibly, in a joint manner, echometer measurements) depending on the detection of the voltage on the cables and of the current circulating in the same cables.

In other words, even when the cable is powered, the monitoring system is capable of checking the integrity thereof monitoring the correct passage of current. Hence, should the cable be cut when it is subjected to voltage, the monitoring system is capable of notifying an anomalous current alarm. Following this alarm, the point in which the fault took place can be located cutting off the voltage supplied to the cable experiencing the alarm. Therefore, the monitoring system is capable of operating with powered or non-powered cables, being automatically configured in the suitable mode.

The monitoring system 1 basically works both with a powered load (in the presence of a voltage exceeding the threshold) and with the electrical system switched off. Hence, once installed, the electrical system can be switched on and off without having to worry about the monitoring system 1, which automatically adjusts to the single cables, each time depending on the detected conditions.

The monitoring system can advantageously be used in systems with wired electrical connections characterized by lengths that can reach up to different kilometres and with cross sections that can be very different from one another.

Figure 6:
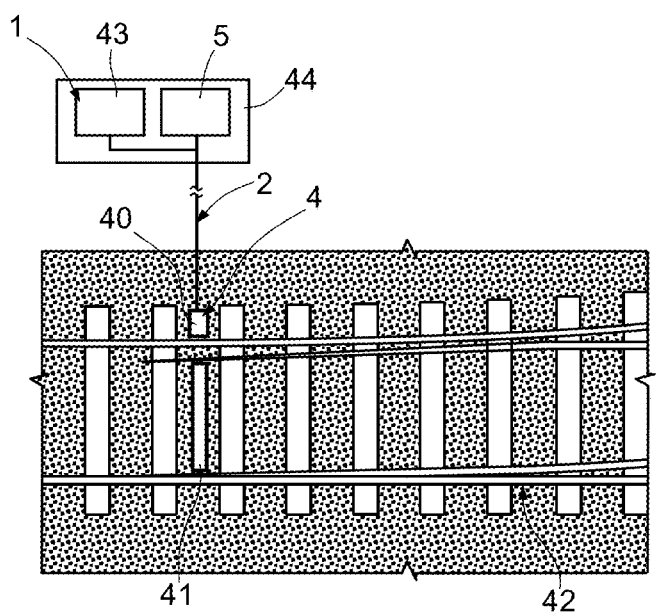
FIG. 6 is a schematic block diagram concerning a possible application of the monitoring system in the railway field.

For example, as schematically shown in FIG. 6, the monitoring system 1 can advantageously be used to monitor the cables of a snow-melting system 40 associated with a railroad switch 41 along railway tracks 42, in order to monitor the integrity of the cables 3 powering heater elements (which, in this case, constitute the electrical loads 4) of the snow-melting system 40.

Advantageously, the monitoring system 1, whose components can be integrated in one or more printed circuit boards—PCB 43, can be housed in a suitable housing and installed in the proximity of the electrical cabinet 44 where the power supply source 5 and the power supply switches 6 are installed, namely close to the point where the wiring 2 originates. The electrical cabinet 44, where the power supply source 5 is installed and from which the cables 3 start, can also be located at distances up to 1 or 2 km from the switch 41.

Finally, it is clear that the solution described above can be subjected to changes and variations, without departing from the scope of the invention defined in the appended claims.

In particular, as already mentioned above, the monitoring system 1 can advantageously be used even in case the remote electrical load is powered by means of a three-phase voltage; in this case, the electrical wires 3' are three for each cable 3 and are sequentially connected in pairs to the monitoring system 1.

Furthermore, the monitoring system 1 may also operate based on the sole impedance measurements carried out for the identification of the integrity fault, namely without the subsequent use of the echometer for the determination of the position of the fault (in many applications, the information concerning the presence of a fault is sufficient, even without the position along the wiring).

Similarly, the presence of the current sensors 30 and of the switching and measuring unit 32, despite being advantageous, is optional for the purposes of the operation of the monitoring system 1.

As already mentioned, it is clear that the monitoring system 1 can advantageously be used in different applications, even in a different field than the railway industry, to which the description above specifically relates, by way of non-limiting example.

The invention claimed is:

1. An automatic monitoring system for monitoring the integrity of a wiring, said wiring having a number of cables, each provided with at least one respective pair of electrical wires configured to couple, in given operating conditions, a respective electrical load to a power supply source, said system comprising:
    an integrity measuring unit, configured to be coupled to said electrical wires in order to perform electrical measurements and check for the presence of faults along said electrical wires;
    a detection unit configured to detect a voltage present in said electrical wires and to enable said integrity measuring unit only in case said voltage has a predetermined relation with a voltage threshold, indicating the fact that said electrical load is not powered by said power supply source; and
    a current measuring unit configured to detect an electric current flowing along electrical wires selectively coupled thereto and to cause generation of an alarm signalling, in case: said voltage does not fulfill the predetermined relation with said voltage threshold, thus indicating that said electrical load is powered by said power supply source; and, jointly, said electric current has a respective predetermined relation with a current threshold;
    wherein said integrity measuring unit comprises an impedance measuring circuit which is configured to apply a measurement signal to a circuit formed by the pair of electrical wires and to obtain a value of an impedance of said circuit; said integrity measuring unit being configured to check for the presence of a fault depending on said impedance value.

2. The system according to claim 1, wherein said integrity measuring unit further comprises an echometer device, configured to perform an echometer measurement on the circuit formed by the pair of electrical wires; said integrity measuring unit being further configured to locate a position of said fault along said wiring depending on said echometer measurement.

3. The system according to claim 1, further comprising an input switching unit, configured to selectively and sequentially couple said integrity measuring unit to the respective electric wires of each one of said cables.

4. The system according to claim 1, further comprising an alarm generation and notification unit, controlled for the generation and the notification of an alarm signalling, upon verification by the integrity measuring unit of a fault along said electrical wires due to a cut or to an interruption.

5. The system according to claim 1, wherein the cables of said wiring are selectively coupled to said power supply source by means of power supply switches; further comprising current sensors, coupled to said current measuring unit and arranged on the electrical wires of the cables of the wiring, downstream of the power supply switches, for the detection of the electric current flowing in said electrical wires.

6. The system according to claim 1, wherein said integrity measuring unit is configured to carry out a comparison between the impedance value of said circuit and a reference impedance value stored during an initialization phase of said monitoring system and to check for the presence of the fault depending on said comparison.

7. The system according to claim 6, further comprising a non-volatile memory to store a reference impedance value associated with the electrical wires of said wiring, being measured during said initialization phase.

8. The system according to claim 1, further comprising a central processing unit, operatively coupled to said integrity measuring unit and configured to control the provision of local and/or remote alarm notification upon detection of a lack of integrity of said wiring; wherein said central processing unit is configured to be interfaced with external processing units so as to enable interrogations on the presence of alarms and/or faults and/or configuration operations of the system.

9. An electrical system comprising: a power supply source; electrical loads configured to be selectively powered by said power supply source and coupled to said power supply source by means of respective cables of a wiring; further comprising the monitoring system according to claim 1, for automatically monitoring of the integrity of said wiring.

10. The system according to claim 9, to be used in the railway field.

11. The system according to claim 10, wherein said electrical loads comprise respective heater elements, which are coupled to at least one railroad switch element of a railway track and are selectively powered by said power supply source in order to locally heat said railroad switch element.

* * * * *